US 6,647,348 B2

(12) United States Patent
Madge

(10) Patent No.: US 6,647,348 B2
(45) Date of Patent: Nov. 11, 2003

(54) LATENT DEFECT CLASSIFICATION SYSTEM

(75) Inventor: Robert Madge, Portland, OR (US)

(73) Assignee: LSI Logic Corporation, Milpitas, CA (US)

( * ) Notice: Subject to any disclaimer, the term of this patent is extended or adjusted under 35 U.S.C. 154(b) by 81 days.

(21) Appl. No.: 09/970,392

(22) Filed: Oct. 3, 2001

(65) Prior Publication Data

US 2003/0069706 A1 Apr. 10, 2003

(51) Int. Cl.[7] ............................................. H01L 21/66
(52) U.S. Cl. ..................... 702/81; 702/35; 702/118; 702/83; 700/110; 700/121
(58) Field of Search ............................ 702/81–84, 35, 702/36, 40, 58, 59, 117, 118, 179, FOR 103, FOR 104, FOR 125, FOR 134, FOR 137, FOR 139, FOR 170, FOR 171; 382/149, 145; 700/109, 110, 121; 324/537, 765, 73.1, 550; 438/14, 16, 17; 365/201, 200

(56) References Cited

U.S. PATENT DOCUMENTS 5,986,950 A  * 11/1999 Joseph ........................ 365/200
5,991,699 A  * 11/1999 Kulkarni et al. ............... 702/83
6,300,771 B1 * 10/2001 Goshima ..................... 324/550

* cited by examiner

Primary Examiner—Hal Wachsman
(74) Attorney, Agent, or Firm—Luedeka, Neely & Graham P.C.

(57) ABSTRACT

A method for identifying an integrated circuit having a latent defect. Test data corresponding to a set of integrated circuits is obtained, where the set of integrated circuits was processed on a single substrate. A subject integrated circuit is selected for analysis from within the set. A subset of integrated circuits is identified from within the set, where the subset includes integrated circuits that were located in close proximity on the substrate to the subject integrated circuit. The test data for the subset is analyzed to determine a defect parameter for the subset. The defect parameter for the subset is compared to a threshold. The subject integrated circuit is classified as having a latent defect when the defect parameter for the subset violates the threshold, and the subject integrated circuit is classified as not having a latent defect when the defect parameter for the subset does not violate the threshold.

20 Claims, 2 Drawing Sheets

|   | A | B | C | D | E |
|---|---|---|---|---|---|
| 1 | 4 | 2 | 3 | 0 | 1 |
| 2 | 3 | 2 | 2 | 0 | 0 |
| 3 | 2 | 0 | 1 | 0 | 0 |
| 4 | 3 | 2 | 1 | 0 | 0 |
| 5 | 2 | 2 | 1 | 0 | 1 |

Fig. 1

LATENT DEFECT CLASSIFICATION SYSTEM

FIELD

This invention relates to the manufacture of integrated circuits. More particularly, this invention relates to identifying integrated circuits that have a high probability of a latent or undetected defect.

BACKGROUND

Integrated circuits, such as semiconductor devices, are manufactured en masse on a substrate that is subsequently diced to produce the integrated circuits on individual portions of the substrate, commonly called chips or dice. Thus, a substrate, even prior to the dicing operation, typically contains many discrete integrated circuits. Prior to dicing, testing equipment is used to functionally and parametrically test the integrated circuits individually, to identify and locate defects in the integrated circuits.

However, some defects in integrated circuits are not detectible immediately. In other words, some integrated circuits contain latent defects which, although they cannot be detected early in the life cycle of the integrated circuit, tend to appear at a later point in the life cycle of the integrated circuit. Accordingly, the tester may indicate that a given integrated circuit does not have any defects, when in fact the defects are merely latent and will appear at a later point in time.

Obviously, it is counter productive to introduce such integrated circuits having latent defects into the stream of commerce. At the least it is an embarrassment to the company that produces such integrated circuits, and at the worst the integrated circuit having the latent defect fails in essential operation and puts human life at risk. Thus, tremendous energy is typically devoted to identifying and removing from the processing stream those integrated circuits that have latent defects.

One such method of identifying integrated circuits with latent defects is called burn in. Burn in is designed to detect early failures of integrated circuits by operating them for a period of time, often under stressful conditions such as elevated temperature or clock speeds above that for which they were designed, to see if they will fail during the testing period. However, burn in methods are generally undesirable for a variety of reasons, such as their expense.

There is a need, therefore, for a system for identifying integrated circuits that have latent defects.

SUMMARY

The above and other needs are provided by a method for identifying an integrated circuit having a latent defect. Test data corresponding to a set of integrated circuits is obtained, where the set of integrated circuits was processed on a single substrate. A subject integrated circuit is selected for analysis from within the set of integrated circuits. A subset of integrated circuits is identified from within the set of integrated circuits, where the subset of integrated circuits includes integrated circuits that were located in close proximity on the substrate to the subject integrated circuit. The test data for the subset of integrated circuits is analyzed to determine a defect parameter for the subset of integrated circuits. The defect parameter for the subset of integrated circuits is compared to a threshold. The subject integrated circuit is classified as having a latent defect when the defect parameter for the subset of integrated circuits violates the threshold, and the subject integrated circuit is classified as not having a latent defect when the defect parameter for the subset of integrated circuits does not violate the threshold.

In this manner, integrated circuits having a likelihood of latent defects are identified without performing a difficult and costly burn in procedure. However, the defect parameter can also be used in other ways. For example, integrated circuits associated with a defect parameter that violates a given value can be selected for, in alternate embodiments, a longer than normal burn in, a shorter than normal burn in, or no burn in at all. Further, the classification for the subject integrated circuit is not based merely on whether the subset of other integrated circuits in close proximity to the subject integrated circuit passed or failed all of their functional and parametric testing. Rather, the classification is based on a defect parameter that is determined from an analysis of the test data for the subset of other integrated circuits. Thus, there is provided a more substantial basis for the classification than merely determining if integrated circuits near the subject integrated circuit are binned as failures.

In a most preferred embodiment the defect parameter comprises an average number of defects for the subset of integrated circuits. The test data for the set of integrated circuits preferable includes defect data for functional tests and parametric tests. Most preferably the method is performed for subject integrated circuits for which the test data indicates no defects. The threshold is preferably violated when the defect parameter is equal to or greater than the threshold. In one embodiment the threshold is a predetermined value, and in an alternate embodiment the method includes the additional step of calculating the threshold based at least in part on the test data for the subset of integrated circuits. Further, the threshold in one embodiment changes based on conditions such as the intended customer for the subject integrated circuit, or on the stability of the process used to manufacture the subject integrated circuit.

Most preferably the subset of integrated circuits includes the eight nearest neighbor integrated circuits to the subject integrated circuit. The test data is preferably obtained for the set of integrated circuits from a tester before the substrate on which the set of integrated circuits were processed is diced. The analysis steps are preferably performed off tester. However, some steps of the method, such as the step of classifying the subject integrated circuit as either having or not having a latent defect, can be performed after the substrate has been diced, and even after the subject integrated circuit has been packaged if substrate identification and location information in regard to the subject integrated circuit has been kept.

BRIEF DESCRIPTION OF THE DRAWING

Further advantages of the invention are apparent by reference to the detailed description when considered in conjunction with the figures, which are not to scale so as to more clearly show the details, wherein like reference numbers indicate like elements in the several views, and wherein:

FIG. 1 is a representational view of a portion of a substrate representing individual integrated circuits and the number of defects for each integrated circuit as determined during a testing operation.

DETAILED DESCRIPTION

Figure 1:
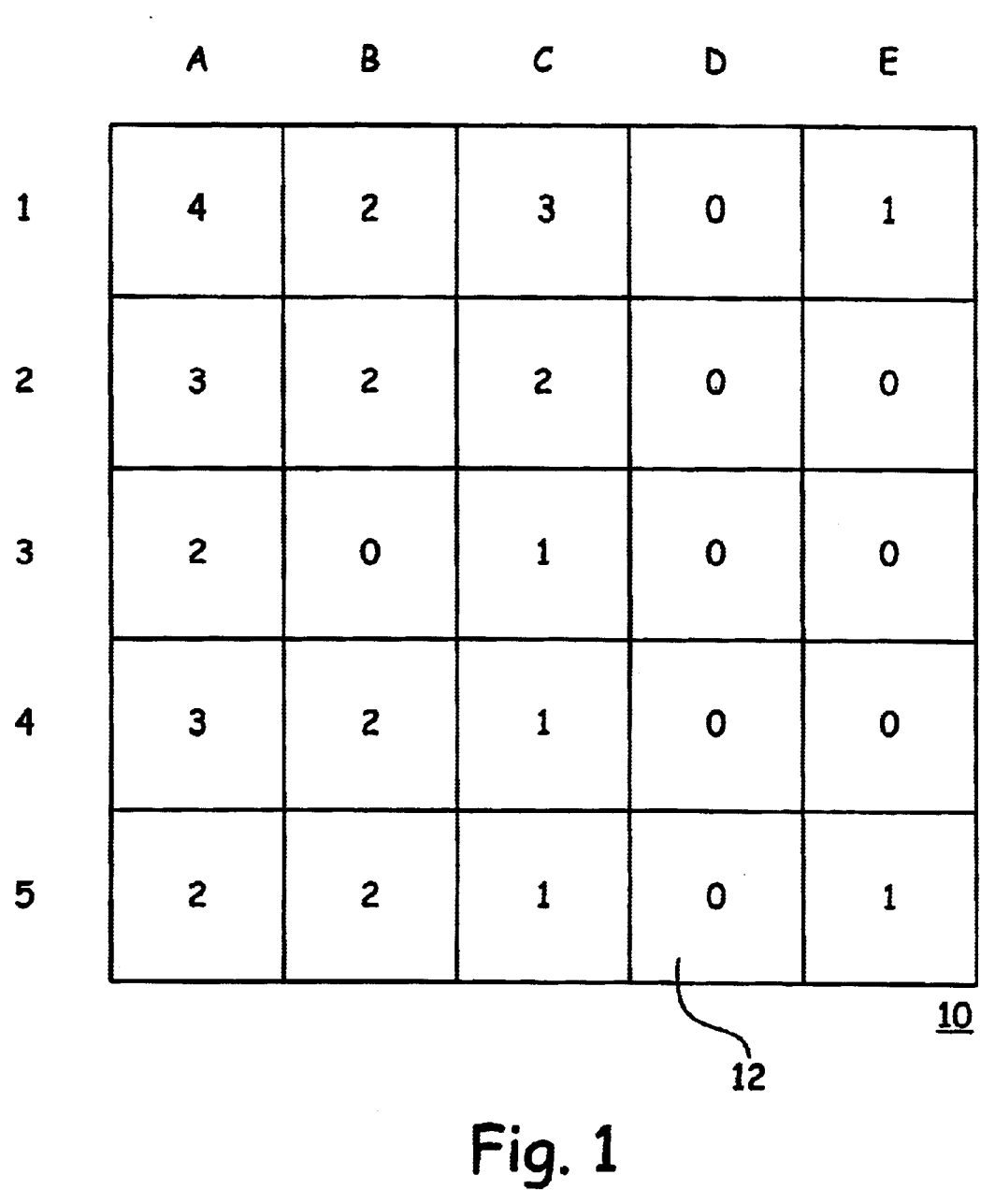
Figure 2:
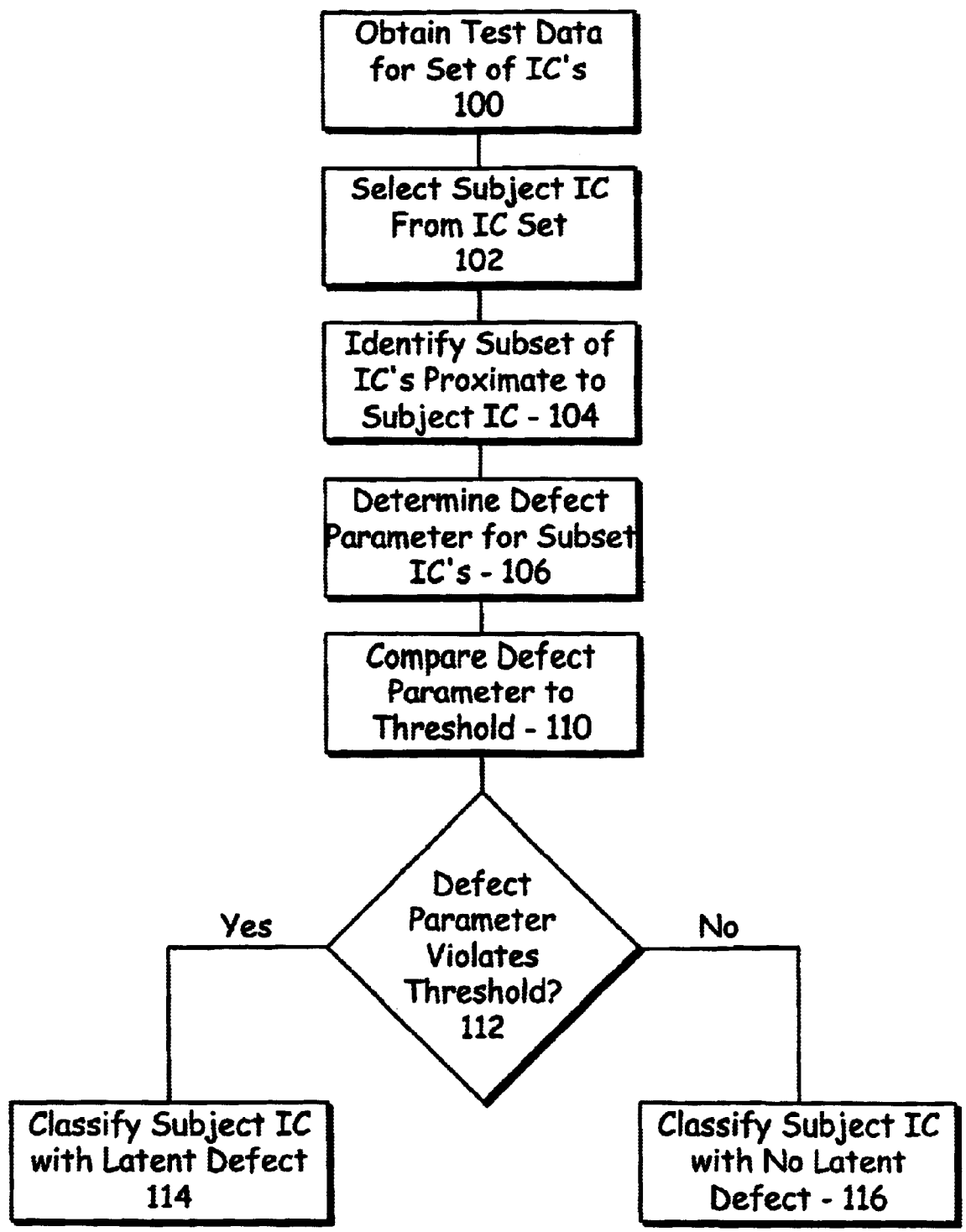
FIG. 2 is a flow chart of a method according to a preferred embodiment of the invention.

The present invention relates to the identification of integrated circuits that are likely to have a latent or undetected defect, based at least in part on their position relative to integrated circuits having detected defects. With reference to FIG. 1, there is shown a representational view of a portion of a substrate 10 having individual integrated circuits 12. Each one of the integrated circuits 12 is located at one of the positions designated as the intersection of one of the rows 1–5 and one of the columns A–E, as depicted in FIG. 1.

The substrate 10 as shown has preferably been tested by a tester, as referenced in block 100 of FIG. 2, to determine which of the integrated circuits 12 have defects, and the number of such defects each integrated circuit 12 has. This information preferably includes complete functional and parametric information for each of the integrated circuits 12 so tested In other words, the tester collecting the data is preferably set to an override fail setting, so that even if a fail is detected in an integrated circuit, the tester continues to collect the full regimen of data from the integrated circuit, such as may be viably enabled with built-in self test (BIST) testing.

Most preferably, this information is collected while the integrated circuits 12 are still united on the substrate 10, or in other words before the substrate 10 is dice into individual integrated circuits 12. However, if proper tracking of the identification and location of the various integrated circuits 12 is maintained, then the method of the present invention as described below can be accomplished after the integrated circuits 12 are diced, and even after such integrated circuits 12 are packaged. However, other influences such as financial constraints tend to limit application of the preferred embodiment of the invention to the integrated circuits 12 while still in wafer form.

In accordance with the invention, a post test analysis of the defect information determined by the tester is analyzed to predict which of the integrated circuits 12 have undetected or latent defects. The post test analysis could be accomplished more or less in real time as the required data, as discussed in more detail below, is acquired. However, in a preferred embodiment the post test analysis is performed off tester so that, among other reasons, the cost associated with the use time of the tester can be kept as low as reasonable.

The post test analysis is preferably accomplished as by computer algorithms configured to evaluate the test data in accordance with the invention. In a preferred embodiment, the number of defects in each integrated circuit is first calculated. For the purposes of example, the number of defects for each integrated circuit A1–E5 are determined as given in FIG. 1.

The defect information is analyzed in accordance with the invention to identify whether a subject integrated circuit, which preferably does not have any detected defects, is likely or unlikely to in fact have latent defects, as given in block 102 of FIG. 2. In a preferred embodiment, this identification is made by analyzing the number of defects present in a subset of integrated circuits located within close proximity to the subject integrated circuit as they reside on the substrate 10, as given in block 104 of FIG. 2. Most preferably the subset of integrated circuits includes the nearest neighbors to the subject integrated circuits, which are those eight integrated circuits that border the subject integrated circuit. However, in alternate embodiments other subsets of integrated circuits may be used, such as the four lateral nearest neighbors, the four diagonal nearest neighbors, or the twenty-four nearest neighbors.

The subset of integrated circuits determined to be within close proximity to the subject integrated circuit may be selected according to one or more of a number of different criteria. For example, it has been determined by the inventors that defects in integrated circuits 12 on a substrate 10 do not tend to be randomly distributed across the surface of the substrate 10. Rather, certain types of defects tend to be clustered within portions of the substrate 10. Thus, the relative size and shape of such portions of clustered defects can be empirically determined, and the size and shape of the subset of integrated circuits can be set based at least in part on that empirical determination.

For example, the integrated circuit 12 located at position B3 is bordered by the following integrated circuits having the number of detected defects as set forth below:

TABLE 1

| Integrated Circuit Location | Number of Detected Defects |
| --- | --- |
| A2 | 3 |
| B2 | 2 |
| C2 | 2 |
| A3 | 2 |
| C3 | 1 |
| A4 | 3 |
| B4 | 2 |
| C4 | 1 |

Preferably, the defects detected in the subset of integrated circuits bordering the subject integrated circuit are analyzed to determine a defect parameter, as given in block 106 of FIG. 2. The defect parameter can take on a number of different forms depending upon the ultimate goals and tolerances of the method implemented. For example, the defect parameter can comprise just one or both of an average and a standard deviation for the number of defects of the subset of integrated circuits. Further, the average calculated could be a mean, median, or mode value. In a most preferred embodiment, the defect parameter is an arithmetic mean of the number of defects for the subset of integrated circuits.

Further, the defect parameter may take into consideration just a subset of the test data for the subset of integrated circuits. In other words, certain portions of the test data for the subset of integrated circuits may be more useful for the prediction of latent defects in the subject integrated circuit than other portions of the test data for the subset of integrated circuits Further still, the defect parameter may be determined by using a first subset of test data from a first subset of integrated circuits, which is then combined with a second subset of test data from a second subset of integrated circuits. Thus, there are a variety of methods by which both the subset of integrated circuits and the defect parameter may be determined, all in accordance with the present invention.

To continue the example started above, the total number of defects present in the subset of eight nearest neighbor integrated circuits bordering the subject integrated circuit located at position B3 is sixteen. Thus, the average number of defects per integrated circuit in the subset, or in other words the arithmetic mean, is two. Thus, in the preferred embodiment, the defect parameter for this example is two.

This defect parameter is compared to a threshold to determine the likelihood that the integrated circuit located at position B3 has latent defects, as given in blocks 110 and 112 of FIG. 2. In a preferred embodiment the threshold is a predetermined parameter, such as is determined empirically from historical data. For example, if it is determined that subject integrated circuits having defect parameters, such as described above, that are equal to or greater than two tend to have latent defects, then the threshold is preferably set to two. In the example started above, the subject integrated circuit would then be classified as an integrated circuit having a latent defect, because the defect parameter calculated for the subject integrated circuit is equal to the threshold, as given in block 114 of FIG. 2.

However, the threshold need not be a predetermined value. Alternately, the threshold is dynamically determined. For example, the threshold may be based on an average for all integrated circuits 12 located on the substrate 10. Alternately, the threshold may be based on a running average for integrated circuits 12 located within a certain portion of the substrate 10. Thus, the invention is not limited to a threshold that is determined prior to testing the integrated circuits 12 on the substrate 10.

Furthermore, the threshold may change according to one or more of a number of different parameters. For example, the threshold may be reduced for subject integrated circuits that are intended for certain applications. For example, subject integrated circuits intended for military applications or other applications where human life may be at risk may have a lower threshold than subject integrated circuits intended for less stringent applications, such as compact disk players intended for the general consumer market Preferably the prices are higher for subject integrated circuits that pass more stringent thresholds, and the prices may be commensurately lower for subject integrated circuits that pass less stringent thresholds. The threshold is preferably based at least in part on the same type of information used to determine the defect parameter.

The threshold may change according to other constraints as well. For example, when a process for producing integrated is first implemented, and the types and propensity of latent defects in the integrated circuits 12 produced are not well characterized, then it may be desirable to set the threshold at a relatively low value so as to reduce the number of subject integrated circuits that are shipped in commerce that have latent defects. After a period of time when the process has been better characterized and is more stable, the threshold may be raised as confidence increases that there has been a general reduction in the number of latent defects in the integrated circuits 12 produced by the process. Thus, there are a number of different ways and a number of different considerations that may selectively be used in formulating the threshold in accordance with the invention.

In another example, the subject integrated circuit located at location D3 is bordered by the following integrated circuits having the following number of detected defects:

TABLE 2

| Integrated Circuit Location | Number of Detected Defects |
| --- | --- |
| C2 | 2 |
| D2 | 0 |
| E2 | 0 |
| C3 | 1 |
| E3 | 0 |
| C4 | 1 |
| D4 | 0 |
| E4 | 0 |

As observed, the total number of defects present in this subset of integrated circuits bordering the subject integrated circuit located at position D3 is four, making the average number of defects per surrounding integrated circuit one half. If, as per the example started above, the threshold is two, then the subject integrated circuit located at position D3 is not classified as having a latent defect, as given in block 116 of FIG. 2.

In the examples given above, the defect parameter is based on the arithmetic mean of the number of defects in the subset of integrated circuits surrounding the subject integrated circuit. However, it is appreciated that, as mentioned above, the defect parameter can be based on other values. For example, the defect parameter is in one embodiment the standard deviation of the number of defects in the subset of integrated circuits surrounding the subject integrated circuit In this example, if the standard deviation for the subset is equal to or greater than a given threshold, then the subject integrated circuit is classified as having a latent defect.

Thus, the invention advantageously enables the classification of a subject integrated circuit as having a high probability of a latent or undetected defect based on the number of detected defects in a subset of surrounding integrated circuits.

The foregoing embodiments of this invention have been presented for purposes of illustration and description. They are not intended to be exhaustive or to limit the invention to the precise form disclosed. Obvious modifications or variations are possible in light of the above teachings. The embodiments are chosen and described in an effort to provide illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A method for identifying an integrated circuit having a latent defect, the method comprising the steps of:

obtaining test data corresponding to a set of integrated circuits that were processed on a single substrate, selecting for analysis a subject integrated circuit from within the set of integrated circuits, identifying a subset of integrated circuits from within the set of integrated circuits, where the subset of integrated circuits includes integrated circuits that were located in close proximity on the single substrate to the subject integrated circuit, analyzing the test data for the subset of integrated circuits to determine a defect parameter for the subset of integrated circuits, comparing the defect parameter for the subset of integrated circuits to a threshold, classifying the subject integrated circuit as having a latent defect when the defect parameter for the subset of integrated circuits violates the threshold, and classifying the subject integrated circuit as not having a latent defect when the defect parameter for the subset of integrated circuits does not violate the threshold.

2. The method of claim 1 wherein the defect parameter comprises an average number of defects for the subset of integrated circuits.

3. The method of claim 1, wherein test data for the subject integrated circuit indicates that the subject integrated circuit has no defects.

4. The method of claim 1, wherein the threshold is violated when the defect parameter is equal to or greater than the threshold.

5. The method of claim 1, further comprising the step of calculating the threshold based at least in part on the test data for the subset of integrated circuits.

6. The method of claim 1, wherein the threshold is a predetermined value.

7. The method of claim 1, wherein the threshold changes based on an intended customer for the subject integrated circuit.

8. The method of claim 1, wherein the threshold changes based on a stability of a process used to manufacture the subject integrated circuit.

9. The method of claim 1, wherein the subset of integrated circuits comprises eight nearest neighbor integrated circuits to the subject integrated circuit.

10. The method of claim 1, wherein the test data for the set of integrated circuits is obtained from a tester before the single substrate on which the set of integrated circuits were processed is diced.

11. The method of claim 1, wherein the step of classifying the subject integrated circuit as one of having a latent defect and not having a latent defect is performed after the single substrate on which the set of integrated circuits were processed is diced.

12. The method of claim 1, further comprising the step of performing a burn in of the subject integrated circuit, where processing conditions for the burn in are selectively adjusted based at least in part on the defect parameter.

13. A method for identifying an integrated circuit having a latent defeat, the method comprising the steps of:

obtaining test data corresponding to a set of integrated circuits that were processed on a single substrate, selecting for analysis a subject integrated circuit from within the set of integrated circuits, where the test data for the subject integrated circuit indicates that the subject integrated circuit has no defects, identifying a subset of integrated circuits from within the set of integrated circuits, where the subset of integrated circuits includes integrated circuits that were located in close proximity on the single substrate to the subject integrated circuit, analyzing the test data for the subset of integrated circuits to determine an average number of defects for the subset of integrated circuits, comparing the average number of defects for the subset of integrated circuits to a threshold, classifying the subject integrated circuit as having a latent defect when the average number of defects for the subset of integrated circuits violates the threshold, and classifying the subject integrated circuit as not having a latent defect when the average number of defects for the subset of integrated circuits does not violate the threshold.

14. The method of claim 13, wherein the threshold is violated when the average number of defects for the subset of integrated circuits is equal to or greater than the threshold.

15. The method of claim 13, further comprising the step of calculating the threshold based at least in part on the test data for the subset of integrated circuits.

16. The method of claim 13, wherein the threshold is a predetermined value.

17. The method of claim 13, wherein the threshold changes based on an intended customer for the subject integrated circuit.

18. The method of claim 13, wherein the threshold changes based on a stability of a process used to manufacture the subject integrated circuit.

19. The method of claim 13, wherein the subset of integrated circuits comprises eight nearest neighbor integrated circuits to the subject integrated circuit.

20. A method for identifying an integrated circuit having a latent defect, the method comprising the steps of:

obtaining test data corresponding to a set of integrated circuits that were processed on a single substrate, wherein the test data for the set of integrated circuits includes defect data for functional tests and parametric tests of the set of integrated circuits, selecting for analysis a subject integrated circuit from within the set of integrated circuits, where the test data for the subject integrated circuit indicates that the subject integrated circuit has no defects, identifying a subset of integrated circuits from within the set of integrated circuits, where the subset of integrated circuits includes eight nearest neighbor integrated circuits to the subject integrated circuit on the single substrate, analyzing the test data for the subset of integrated circuits to determine an average number of defects for the subset of integrated circuits, comparing the average number of defects for the subset of integrated circuits to a predetermined threshold, classifying the subject integrated circuit as having a latent defect when the average number of defects for the subset of integrated circuits is equal to or greater than the predetermined threshold, and classifying the subject integrated circuit as not having a latent defect when the average number of defects for the subset of integrated circuits is less than the predetermined threshold.

* * * * *